United States Patent
Roset et al.

(10) Patent No.: US 7,381,101 B2
(45) Date of Patent: Jun. 3, 2008

(54) BATTERY POST CONNECTOR

(75) Inventors: Josep Maria Roset, Tarragona (ES); Ramon Pinana Lopez, Tarragona (ES)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 11/510,118

(22) Filed: Aug. 25, 2006

(65) Prior Publication Data

US 2008/0050985 A1 Feb. 28, 2008

(51) Int. Cl.
*H01R 4/28* (2006.01)
(52) U.S. Cl. ...................................... 439/754
(58) Field of Classification Search ............... 439/754, 439/522, 762, 621; 307/10.1, 9.1, 134, 136; 320/105, 107
See application file for complete search history.

(56) References Cited

U.S. PATENT DOCUMENTS

| | | | | |
|---|---|---|---|---|
| 2,324,082 | A | * | 7/1943 | Heim ........................ 439/522 |
| 4,149,093 | A | | 4/1979 | D'Alessio et al. |
| 4,252,390 | A | * | 2/1981 | Bowling ..................... 439/73 |
| 4,675,255 | A | | 6/1987 | Pfeifer et al. |
| 4,813,128 | A | * | 3/1989 | Massopust ................... 29/830 |
| 5,645,448 | A | | 7/1997 | Hill |
| 5,903,154 | A | | 5/1999 | Zhang et al. |
| 5,939,861 | A | | 8/1999 | Joko et al. |
| 6,218,805 | B1 | | 4/2001 | Melcher |
| 6,304,062 | B1 | * | 10/2001 | Batson ....................... 320/134 |
| 6,551,147 | B2 | | 4/2003 | Wakata et al. |
| 6,573,723 | B2 | | 6/2003 | Baston |
| 6,628,102 | B2 | | 9/2003 | Batson |
| 6,787,935 | B2 | * | 9/2004 | Heim ........................ 307/10.1 |
| 6,943,455 | B1 | | 9/2005 | Maxwell |
| 6,956,166 | B2 | * | 10/2005 | Kishimoto .................. 174/559 |
| 7,039,533 | B2 | | 5/2006 | Bertness et al. |
| 7,081,755 | B2 | | 7/2006 | Klang et al. |
| 2001/0023037 | A1 | | 9/2001 | Kieninger et al. |
| 2001/0033171 | A1 | | 10/2001 | Batson |
| 2002/0180405 | A1 | | 12/2002 | Batson |
| 2002/0182493 | A1 | | 12/2002 | Ovshinsky et al. |
| 2003/0038637 | A1 | | 2/2003 | Bertness et al. |
| 2003/0057770 | A1 | | 3/2003 | Heim |
| 2003/0203681 | A1 | | 10/2003 | Liang |
| 2003/0232546 | A1 | | 12/2003 | Davis |
| 2003/0236033 | A1 | | 12/2003 | Freitag |
| 2004/0048142 | A1 | | 3/2004 | Marusak et al. |
| 2004/0087219 | A1 | | 5/2004 | Freitag |
| 2004/0232918 | A1 | | 11/2004 | Bertness et al. |

(Continued)

FOREIGN PATENT DOCUMENTS

DE 3532044 A1 3/1987

(Continued)

OTHER PUBLICATIONS

Great Britain Search and Examination Report for Application No. GB0716180.5, mailed Nov. 22, 2007, 5 pages.

*Primary Examiner*—Alexander Gilman
(74) *Attorney, Agent, or Firm*—Brooks Kushman P.C.

(57) ABSTRACT

A connector suitable for establishing an electrical connection with any number of batteries. The connector including any number of features for assessing operating characteristics associated with the battery, such as but not limited to current, voltage, and temperature. The connector optionally being of a robust design and configured to ameliorate vibrations and sustain hammer tests.

19 Claims, 2 Drawing Sheets

U.S. PATENT DOCUMENTS

| | | |
|---|---|---|
| 2005/0014408 A1 | 1/2005 | Swiatek et al. |
| 2005/0035737 A1 | 2/2005 | Elder et al. |
| 2005/0057865 A1 | 3/2005 | Veloo et al. |
| 2005/0058892 A1 | 3/2005 | Ovshinsky et al. |
| 2005/0101197 A1 | 5/2005 | Wirth |
| 2005/0190519 A1 | 9/2005 | Brown et al. |
| 2005/0264296 A1 | 12/2005 | Philbrook |
| 2006/0003627 A1 | 1/2006 | Freitag |
| 2006/0057899 A1 | 3/2006 | Tokunaga |
| 2006/0076466 A1 | 4/2006 | Serra |

FOREIGN PATENT DOCUMENTS

| | | |
|---|---|---|
| DE | 4410061 A1 | 9/1994 |
| DE | 10118027 A1 | 11/2002 |
| DE | 10118051 A1 | 11/2002 |
| DE | 10 2004 055 848 A1 | 5/2006 |
| DE | 10 2004 055 847 A1 | 6/2006 |
| DE | 10 2004 055 849 A1 | 6/2006 |
| JP | 11170932 A | 6/1999 |
| WO | 0131718 A2 | 5/2001 |
| WO | 02082617 A1 | 10/2002 |

\* cited by examiner

BATTERY POST CONNECTOR

BACKGROUND OF THE INVENTION

1. Field of the Invention

The present invention relates to battery post connectors of the type having capabilities to sense battery operating conditions.

2. Background Art

The present invention relates to battery post connectors of the type having capabilities to sense battery operating conditions. These type of connectors are commonly employed in automotive vehicles having lead-acid or some other type of battery or similar energy storage device. The connectors are advantageous in sensing and reporting battery operating conditions for use with a junction box or vehicle system controller.

As one skilled in the art will appreciate, automotive vehicles and vehicles having batteries may experience any number of forces during operation. These forces may induce vibrations and other forces throughout the vehicle and especially between the battery and battery post connector. The vibration, in some cases, can disrupt the electrical connection between the battery and battery post connector in such a manner as to influence the ability of the battery post connector to accurately sense and report the various operating conditions of the battery.

The inability or questionable ability of the connector to accurately sense and report the operating characteristics of the battery can be a particular problematic if the junction box or other vehicle system controller is relying on the accuracy such information when controlling, directing, or otherwise influencing operation of the vehicle or its sub-systems.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
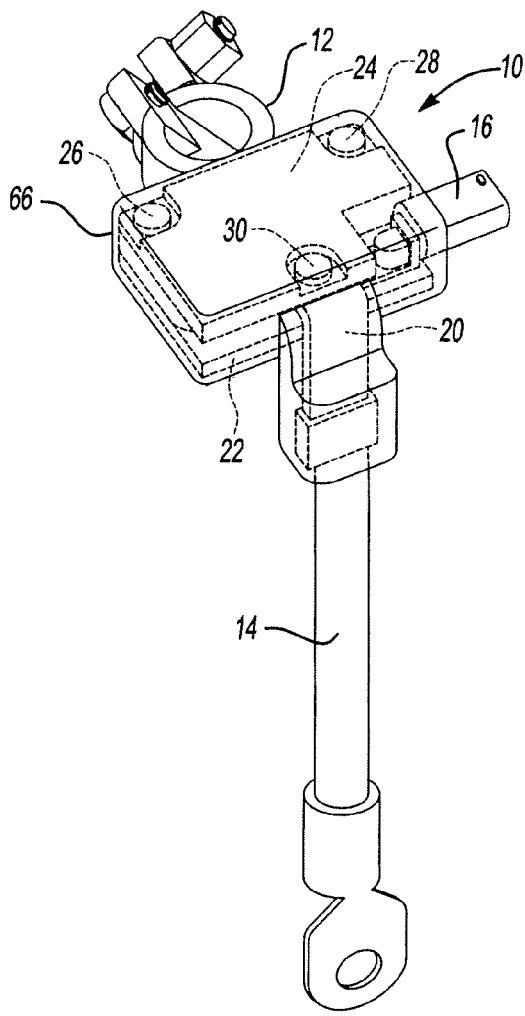
FIG. 1 illustrates a battery post connector in accordance with one non-limiting aspect of the present invention.

FIG. 1 illustrates a battery post connector 10 in accordance with one non-limiting aspect of the present invention. The connector 10 may be configured for connecting to a battery post (not shown) of a battery (not shown), such as but not limited to a lead-acid or other battery commonly employed within vehicles. The connector 10 may be securely connected to the battery post with compressive tightening of a clamping terminal 12 or through another suitable connection.

The clamping terminal 12 may comprise a tinned brass or other material suitable for conducting electricity from the battery. The terminal adapter 12, as described below in more detail, may extend relative to the outward clamping end used to connect to the battery post. The terminal adapter 12 may include a screw or other fastener for compressively applying force against the battery post and for establishing the electrical connection thereto. The terminal adapter 12 is shown for attachment to a cylindrical battery post for exemplary purposes and without intending to limit the scope and contemplation of the present invention. Any type of connection to the battery may be used.

The connector 10 may interface with a cable 14, wire, or other element suitable for conducting electricity to another element within the vehicle, such as but not limited to a vehicle chassis (not show), grounding element, etc. The connector 10 may further include a network interface 16 for interfacing signals with a network vehicle element, such as but not limited to a vehicle system controller (not shown), junction box, bus, network etc.

The network interface 16 may be used to interface any number of signals between the connector 10 and the vehicle system controller or other network vehicle element, i.e., any element not to receiving electricity directly through the network interface connection. For example, one or two-way communications may be established with the connector 10, such as but not limited communications associated with sensing and measuring current, voltage, temperature, and other operating parameters associated with the battery, as described in more detail below.

Figure 2:
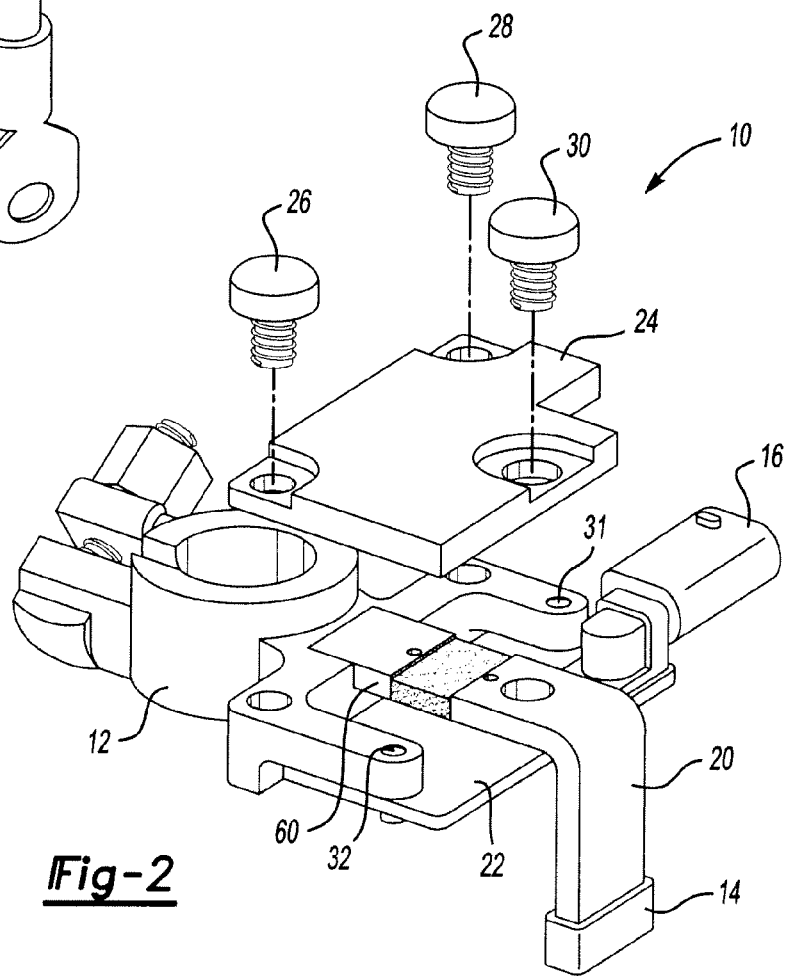
FIG. 2 illustrates a partial assembly view of the connector in accordance with one non-limiting aspect of the present invention.

FIG. 2 illustrates a partial assembly view of the connector in 10 accordance with one non-limiting aspect of the present invention. This view illustrates a shunt 20, printed circuit board (PCB) 22, plate 24, and fasteners 26-32 that may be included with the connector 10. These elements may combine with the elements described above to support connector operations, such as but not limited to measuring/sensing current, voltage, and temperatures associated with the battery.

Figure 3:
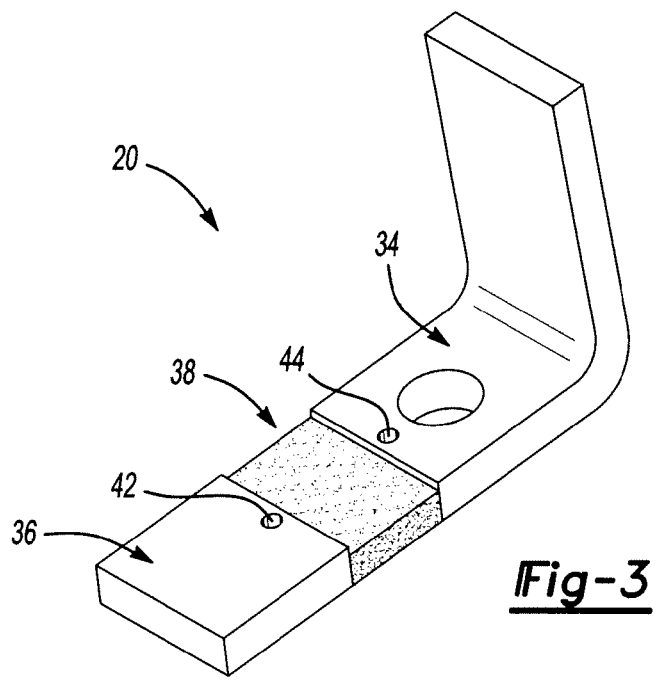
FIG. 3 illustrates a shunt in accordance with one non-limiting aspect of the present invention.

FIG. 3 illustrates the shunt 20 in accordance with one non-limiting aspect of the present invention. The shunt 20 may comprise any material have properties sufficient to facilitate electrical connectivity between the terminal adapter and the wire. The shunt 20 is shown as a bimetallic object having copper alloy portions 34-36 and a resistor copper alloy portion 38, such as but not limited to manganin. The copper 34-36 portions correspond with the ends of the shunt and the resistor copper alloy portion 38 may be arranged therebetween such that current must flow from through one copper portion 34, through the resistor copper alloy portion 38, and finally through the other copper portion 36 in order to travel from the battery to the wire 14.

The resistor copper alloy portion 38 of the shunt 20 may be used a measuring element suitable for conducting high currents. Sensing apertures 42-44 may be included within or outside the boundaries of the resistor copper alloy portion 38 for sensing a voltage drop therethrough. The known resistive characteristics of the resistor copper alloy may be used in conjunction with the voltage drop to determine current flow through the shunt 20. In this manner, the present invention is able to sense voltage and current associated with the battery.

Figure 4:
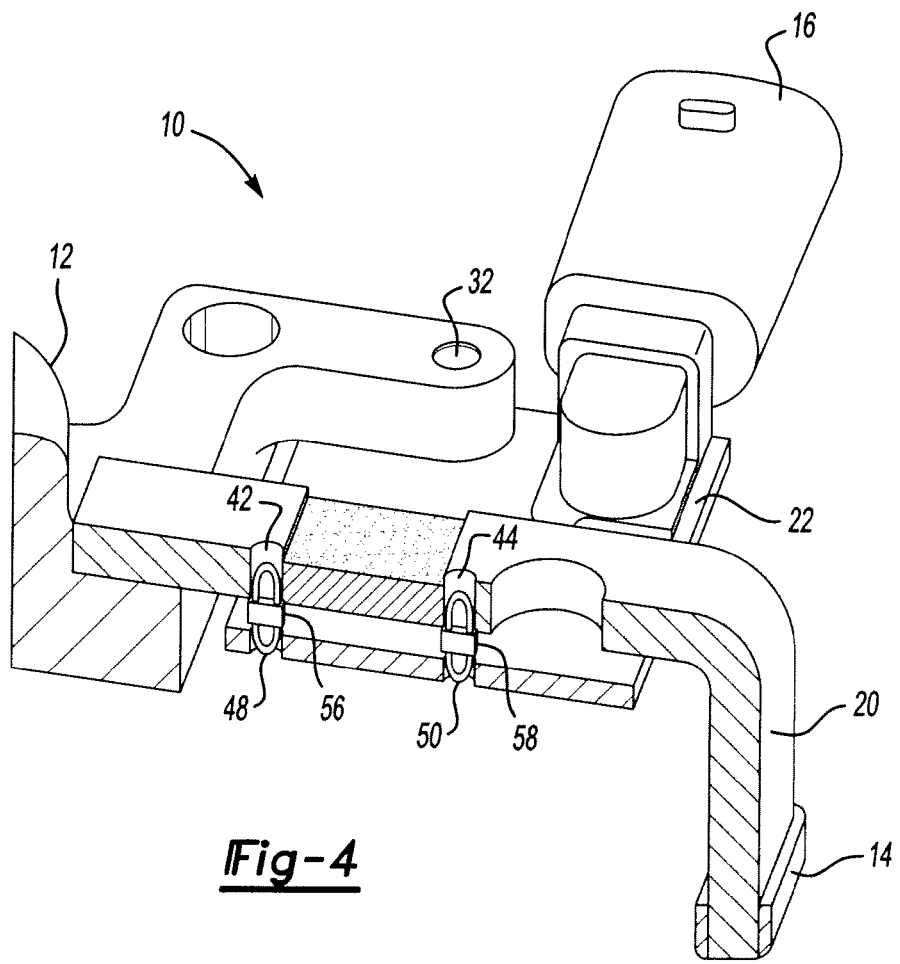
FIG. 4 illustrates a cross-sectional view of the connector in accordance with one non-limiting aspect of the present invention.

FIG. 4 illustrates a cross-sectional view of the connector 10 in accordance with one non-limiting aspect of the present invention. This view illustrates a pair of connecting pins 48-50 that may be used to electrically connect the shunt 20 with the PCB 20. The pin connectors 48-50 may be aligned with the sensing apertures 42-44 of the shunt 20 and corresponding apertures and electronics on the PCB 22 to facilitate sensing the voltage drop and determining the current as a function thereof.

The know resistivity of the resistor copper alloy portion 38 is helpful in assuring the accuracy and consistency of the PCB current calculations. Of course, the present is not intended to be limited to the shunt 20 having the resistor copper alloy portion 38 and fully contemplates the use of any number of other suitable materials, including making the shunt out of a single material/composition, i.e., without the bimetallic composition shown in FIG. 3.

The PCB 22 may include any number of other sensors and circuitry to perform any number of logical functions associated with determining the operating conditions of the battery or other operations associated with or based on the connector 10 and its function and performance. For example, the PCB 22 may include a temperature sensor (not shown) for sensing connector temperature and/or battery temperature.

The temperature sensor may be used to sense the battery temperature as a function of the terminal adapter 12 temperature. This may include establishing a thermal coupler or other element between the terminal adapter 12 and the PCB 22 so as to facilitate temperatures sensing. A negative or positive temperature coefficient element may be include proximate the thermal coupler to facilitate sensing the temperature. Optionally, one of the fasters 31-32 connected between the terminal adapter 12 and PCB 22 may be used as the thermal coupler.

The PCB 22 is illustrated for exemplary purposes and without intending to limit the scope and contemplation of the present invention. The present invention fully contemplates the use of any type of logically functioning element, such as but not limited to a discrete or integrated circuit, having properties sufficient to facilitate determining battery operating conditions.

The connecting pins 48-50 may include an offset 56-58 feature for offsetting the PCB 22 relative to the shunt 20. The offset feature may be a simple spacer included within the pins and/or some other element, such as but not limited to a washer (rubber or non-rubber), ring, etc. The pins 48-50 may be relatively free-floating (i.e. sufficient to permit and electrical connection) and/or compression fitted within the apertures on the PCB 22 and shunt 20. In this manner, the PCB may be offset from the shunt so as to facilitate vibratory isolation of the PCB 22 relative to the shunt 20.

Other features suitable to sensing the voltage drop may be used instead of or in place of the electrically conducting pins 48-50. For example, more permanent or non-removable connections, such as those associated with soldered based connections, may be used. The non-solder or removable connections provided by the compliant pins 48-50 may be more desirable in limiting the influence of vibrations and simplifying manufacturing.

Returning to FIG. 2, the shunt 20 may be welded, soldered, or otherwise attached to the terminal adapter 12. The terminal adapter 12 may include a bare (non-plated) recess ledge 60 for receiving and electrically connecting to the shunt 20. The connection may be suitable to permit electricity to flow between the connected to battery post and connector 10, such as but not limited to a laser soldered connection. As one skilled in the art will appreciate, the connection between the shunt 20 and battery terminal 12 and the shunt 20 and wire 16 are particularly susceptible to vibrations and other forces associated with vehicle operations.

For example, the shunt 20 may be soldered to the wire 16 in order to provide a secure mechanical connection. This connection may permit vibrations or other forces associated with the vehicle chassis or other vehicle element to which the wire 16 is connected to travel up the wire to the connector 10. Similar vibrations may be imparted by the battery terminal 12 such that the PCB 22, shunt 20, adapter 16, and other elements associated with the connector 10 may be exposed to various vibrations depending on vehicle operations.

The receptivity of the connector 10 to these and other vibrations can become problematic for the electronic elements, connections, and other features of the connector 10 that are used to perform the various operations associated with determining battery current, voltage, temperatures, etc. Accordingly, one non-limiting aspect of the present invention relates to ameliorating these vibrations and improving the robustness of the connector.

The plate 24 may be included to help reduce vibratory susceptibility of the connector 10. The plate 24 may be secured by the fasteners 26-30 or other elements to the terminal adapter 12 and shunt 20 with a portion of the plate 24 optionally covering both of the shunt 20 and PCB 22. Additional fasteners 31-32 may be included to fasten the PCB 22 to the bottom side of the terminal adapter 12 such that the plate 24 and PCB 22 are both secured to the terminal adapter 12 and the plate 24 and shunt 20 are secured to each other. This arrangement compresses the plate 24 against the shunt-to-adapter connection associated with the shoulder 60 and secures the offset of the PCB 22 relative to the shunt 20.

The compressive force or snug fit of the plate 24 over top of the shunt 20 and terminal adapter 12 may be helpful in preventing the vibrations from causing an electrical disruption or disconnect between the terminal adapter 12 and the shunt 20. Likewise, the mechanical connection between the shunt 20 and the plate 24 may be helpful in transferring the vibrations from the shunt 20 to the plate 24 and the terminal adapter 12, as opposed to the PCB 20. Still further, the offsetting of the PCB relative to the shunt 20, by way of its fastening to the bottom side of the terminal adapter 12 and the optionally pin offsets 56-58, may be helpful in isolating the PCB 22 from vibrations.

In this manner, the plate 24 of the present invention may be helpful in isolating the connector electronics from vibrations and electrical connections from the vibrations induced during vehicle operations. Optionally, the plate 24 may comprise a non-conducting material to insure electrical isolation of the plate relative to the terminal adapter 12 and the shunt 20. The plate 24 material may be a glass fiber or other material having properties suitable to absorbing or compensating for the induced vibrations.

In addition to the above-noted benefits, the plate 24 may be beneficial in certain automotive applications where the connector 10 may be required to pass shock tests. One type of shock test relates to striking or otherwise subjecting the topside of the connector 10 to a force or blow at a particular force. This type of test is commonly referred to as a hammer test in which a ball of 7000 grams is projected from a vertical distance of 0.5 meters against the plate. The plate 24 and its relatively rigid structure may overlay the shunt 20 and PCB 22 so as to limited transmission of the topside blow to the shunt 20 or PCB 22, thereby protecting the PCB 22 and other elements of the connector 10.

Optionally, to enhance system integrity against contaminates, water, debris, etc. and/or to facilitate packaging and other component design, a resin 66 or hot melt layer or a plastic material may be included around the various connector elements. The resin 66 may comprise any suitable material and be used to encase the connector features in a waterproof mold. The mold 66 may further enhance the electrical isolation of the connector and provide extra protection against vibration and during shock tests.

As demonstrated above, the present invention provides a robust connector suitable for use with vehicle batteries and other batteries. One aspect of the present invention relates to reducing vibratory susceptibility of the connector by including the plate and/or offsetting the PCB. Another aspect relates to reducing shock test susceptibility of the connector by including the plate and/or encapsulating the connector within a resin. Some or all of these aspect may be employed with the present invention without deviating from the scope and contemplation of the present invention.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A battery post connector for use in sensing current flow of a vehicle battery, the connector comprising:
    a terminal adapter configured for compressively connecting to a battery post of the vehicle battery and establishing an electrical connection thereto;
    a shunt in communication with the terminal adapter and configured for directing current flow between the terminal adapter and a vehicle element;
    a printed circuit board (PCB) configured to calculate current flow through the shunt as a function of a voltage drop across a portion of the shunt;
    a plate overlaying at least a portion of the PCB and shunt and configured to ameliorate shunt vibrations; and
    wherein the plate is an independent element fastened to both of the terminal adapter and shunt.

2. The connector of claim 1 further comprising a network interface for communicating signals between the PCB and a remote network element, the network interface being separate from the electrical connection between the shunt and vehicle element.

3. The connector of claim 1 wherein the plate is not fastened to the PCB.

4. The connector of claim 1 further comprising a resin encapsulating the shunt, plate, PCB, and at portion of the terminal adapter.

5. The connector of claim 1 wherein the PCB includes a temperature sensor for sensing temperature.

6. The connector of claim 1 wherein the terminal adapter includes a recessed ledge for receiving the shunt, the recessed ledge corresponding with a thickness of the shunt such that a top side of the shunt lies flush with a top side of the terminal adapter and a bottom side of the plate when the plate is fastened to the top side of the terminal adapter.

7. The connector of claim 6 wherein the shunt is soldered to the terminal adapter and include a three materials sections.

8. The connector of claim 1 wherein the plate is fastened to a top side of the terminal adapter and the PCB is fastened to a bottom side of the terminal adapter.

9. The connector of claim 8 wherein the PCB is fastened to the bottom side of the terminal adapter such that the PCB is offset from the shunt.

10. The connector of claim 1 further comprising a pair of connecting pins configured for establishing an electrical connection between the shunt and PCB, the electrical connection suitable for use by the PCB in determining the voltage drop.

11. The connector of claim 10 further comprising corresponding apertures in each of the PCB and the shunt for receipt of the connecting pins and establishment of the electrical connection.

12. The connector of claim 10 wherein the connecting pins includes offsets to facilitate offsetting the PCB relative to the shunt.

13. A battery post connector for use in sensing current flow of a vehicle battery, the connector comprising:
    a terminal adapter configured for compressively connecting to a battery post of the vehicle battery and establishing an electrical connection thereto;
    a shunt in communication with the terminal adapter and configured for directing current flow between the terminal adapter and a vehicle element;
    a printed circuit board (PCB) configured to calculate current flow through the shunt as a function of a voltage drop across a portion of the shunt;
    a plate overlaying at least a portion of the PCB and shunt, wherein the plate is fastened to the terminal adapter and the shunt;
    a pair of connecting pins configured for establishing an electrical connection between the shunt and PCB, the electrical connection suitable for use by the PCB in determining the voltage drop;
    a network interface for communicating signals between the PCB and
    a remote network element, the network interface being separate from the electrical connection between the shunt and vehicle element; and
    a resin encapsulating the shunt, plate, PCB, and at portion of the terminal adapter.

14. The connector of claim 13 wherein the PCB includes a temperature sensor for sensing temperature.

15. A connector for use in sensing current flow of a battery, the connector comprising:
    a terminal adapter configured for connecting to the battery and establishing an electrical connection thereto;
    a shunt in communication with the terminal adapter and configured for directing current flow between the terminal adapter and another remote element;
    a printed circuit board (PCB) in electrical communication with the shunt and configured for determining operating characteristics associated with the battery as a function thereof; and
    a plate overlaying at least a portion of the PCB and shunt, the plate being sufficiently thick to protect the PCB against a hammer test;
    wherein an entire bottom side of the plate is flat such that the outer edges of the plate rest against and are coplanar with a top side of the terminal adapter and the shunt.

16. The connector of claim 15 wherein the terminal adapter includes a recessed ledge for receiving the shunt, the recessed ledge corresponding with a thickness of the shunt such that a top side of the shunt lies flush with a top side of the terminal adapter and a bottom side of the plate when the plate is fastened to the top side of the terminal adapter.

17. The connector of claim 15 wherein the plate is fastened to a top side of the terminal adapter and the PCB is fastened to a bottom side of the terminal adapter such that the PCB is offset from the shunt by a thickness of a portion of the terminal adapter.

18. The connector of claim 15 further comprising a pair of connecting pins configured for establishing the electrical connection between the shunt and PCB, the electrical connection suitable for use by the PCB in determining a voltage drop associate with current flow through the shunt.

19. The connector of claim 18 further comprising corresponding apertures in each of the PCB and the shunt for receipt of the connecting pins and establishment of the electrical connection, wherein the connecting pins includes offsets to facilitate offsetting the PCB relative to the shunt.

* * * * *